United States Patent
Era et al.

(10) Patent No.: US 10,199,218 B2
(45) Date of Patent: Feb. 5, 2019

(54) METHOD FOR MANUFACTURING GROUP III-V NITRIDE SEMICONDUCTOR EPITAXIAL WAFER

(71) Applicant: Mitsubishi Electric Corporation, Tokyo (JP)

(72) Inventors: Atsushi Era, Tokyo (JP); Susumu Hatakenaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/657,242

(22) Filed: Jul. 24, 2017

(65) Prior Publication Data
US 2018/0166271 A1    Jun. 14, 2018

(30) Foreign Application Priority Data
Dec. 13, 2016    (JP) .................. 2016-241448

(51) Int. Cl.
| | |
|---|---|
| *H01L 21/02* | (2006.01) |
| *H01L 29/20* | (2006.01) |
| *H01L 29/205* | (2006.01) |
| *H01L 29/66* | (2006.01) |
| *H01L 29/778* | (2006.01) |
| *H01L 21/205* | (2006.01) |
| *H01L 29/812* | (2006.01) |
| *C23C 16/30* | (2006.01) |

(52) U.S. Cl.
CPC ........ *H01L 21/0262* (2013.01); *C23C 16/303* (2013.01); *H01L 21/02* (2013.01); *H01L 21/0254* (2013.01); *H01L 21/205* (2013.01); *H01L 29/20* (2013.01); *H01L 29/2003* (2013.01); *H01L 29/205* (2013.01); *H01L 29/66* (2013.01); *H01L 29/66462* (2013.01); *H01L 29/778* (2013.01); *H01L 29/7787* (2013.01); *H01L 29/812* (2013.01)

(58) Field of Classification Search
None
See application file for complete search history.

(56) References Cited

U.S. PATENT DOCUMENTS

| | | | |
|---|---|---|---|
| 2004/0142550 A1* | 7/2004 | Nakamura | ............ C30B 25/02 438/604 |
| 2006/0128122 A1* | 6/2006 | Bousquet | ............. C30B 23/02 438/478 |

(Continued)

FOREIGN PATENT DOCUMENTS

JP    2012-119429 A    6/2012

*Primary Examiner* — Khaja Ahmad
(74) *Attorney, Agent, or Firm* — Studebaker & Brackett PC

(57) ABSTRACT

A Ga source gas and a nitrogen source gas are supplied to form a GaN channel layer on a semiconductor substrate. Next, a temperature is lowered while supplying at least the nitrogen source gas. Next, the Ga source gas is not supplied and an Al source gas and the nitrogen source gas are supplied. Next, the temperature is raised while not supplying the Al source gas and the Ga source gas and supplying the nitrogen source gas. Next, the Al source gas and the nitrogen source gas are supplied and at least one of the Ga source gas and an In source gas is supplied to form a $Al_xGa_yIn_zN$ barrier layer ($x+y+z=1$, $x>0$, $y\geq 0$, $z\geq 0$, $y+z>0$).

10 Claims, 5 Drawing Sheets

(56) References Cited

U.S. PATENT DOCUMENTS

| | | | |
|---|---|---|---|
| 2006/0180077 A1* | 8/2006 | Suda | C30B 29/403 |
| | | | 117/95 |
| 2008/0233721 A1* | 9/2008 | Kosaka | H01L 21/0237 |
| | | | 438/493 |
| 2009/0057646 A1* | 3/2009 | Hirayama | H01L 21/0237 |
| | | | 257/13 |
| 2012/0132962 A1* | 5/2012 | Sato | C30B 25/02 |
| | | | 257/201 |
| 2013/0069208 A1* | 3/2013 | Briere | H01L 21/0237 |
| | | | 257/655 |
| 2014/0045289 A1* | 2/2014 | Nago | H01L 33/0075 |
| | | | 438/47 |

* cited by examiner

METHOD FOR MANUFACTURING GROUP III-V NITRIDE SEMICONDUCTOR EPITAXIAL WAFER

BACKGROUND OF THE INVENTION

Field

The present invention relates to a method for manufacturing a group III-V nitride semiconductor epitaxial wafer.

Background

Group III-V nitride semiconductors are characterized by their high saturation electron speed and high withstand voltage, and high electron mobility transistors (HEMTs) that generate a high-concentration two-dimensional electron gas on an interface using a hetero-structure are particularly attracting attention. With a HEMT made up of $Al_xGa_yIn_zN$ ($x+y+z=1$) which is a group III-V nitride semiconductor (hereinafter referred to as "GaN-based HEMT"), a high-concentration two-dimensional electron gas is generated by a polarization effect caused by providing a barrier layer made of $Al_xGa_yIn_zN$ ($x+y+z=1$, $x>0$, $y\geq 0$, $z\geq 0$) having a greater band gap than a channel layer made of $Al_xGa_yIn_zN$ ($x+y+z=1$, $x\geq 0$, $y>0$, $z\geq 0$) on the channel layer. For this reason, sheet resistance of the two-dimensional electron gas decreases and high-speed and high-output operation is made possible.

In order to achieve a high-speed and high-output operation with the GaN-based HEMT, mobility needs to be increased. To increase mobility, it is effective to enhance steepness of a composition variation on an interface between the channel layer and the barrier layer. In order to enhance steepness of the interface, a method for manufacturing an epitaxial wafer for a GaN-based HEMT has been proposed so far, in which a growth interruption step of supplying neither Ga source gas nor Al source gas is provided after forming a channel layer made of GaN, a pre-flow step of supplying not a Ga source gas but an Al source gas is executed after the growth interruption step, the Ga source gas and the Al source gas are supplied to form a barrier layer made of $Al_xGa_{1-x}N$ after the pre-flow step (for example, see JP 2012-119429 A).

The conventional manufacturing method has a problem that Ga in the channel layer is mixed into the barrier layer, which leads to loss of steepness of the interface and makes it impossible to obtain any GaN-based HEMT having high mobility.

SUMMARY

The present invention has been implemented to solve the above-described problem and it is an object of the present invention to provide a method for manufacturing a group III-V nitride semiconductor epitaxial wafer having high steepness of an interface between a channel layer and a barrier layer, and suppressing crystallinity deterioration in the barrier layer.

According to the present invention, a method for manufacturing a group III-V nitride semiconductor epitaxial wafer includes: a first growth step of supplying a Ga source gas and a nitrogen source gas to form a GaN channel layer on a semiconductor substrate; after the first growth step, a temperature lowering step of lowering a temperature while supplying at least the nitrogen source gas; after the temperature lowering step, a pre-flow step of not supplying the Ga source gas and supplying an Al source gas and the nitrogen source gas; after the pre-flow step, a temperature raising step of raising the temperature while not supplying the Al source gas and the Ga source gas and supplying the nitrogen source gas; and after the temperature raising step, a second growth step of supplying the Al source gas and the nitrogen source gas and supplying at least one of the Ga source gas and an In source gas to form a $Al_xGa_yIn_zN$ barrier layer ($x+y+z=1$, $x>0$, $y\geq 0$, $z\geq 0$, $y+z>0$).

In the present invention, the temperature in the pre-flow step is lower than the temperature in the step of forming the channel layer and the temperature in the step of forming the barrier layer is higher than the temperature in the pre-flow step. Therefore, a group III-V nitride semiconductor epitaxial wafer having high steepness of an interface between a channel layer and a barrier layer, and suppressing crystallinity deterioration in the barrier layer can be manufactured.

Other and further objects, features and advantages of the invention will appear more fully from the following description.

DESCRIPTION OF EMBODIMENTS

A method for manufacturing a group III-V nitride semiconductor epitaxial wafer according to the embodiments of the present invention will be described with reference to the drawings. The same components will be denoted by the same symbols, and the repeated description thereof may be omitted.

First Embodiment

Figure 1:
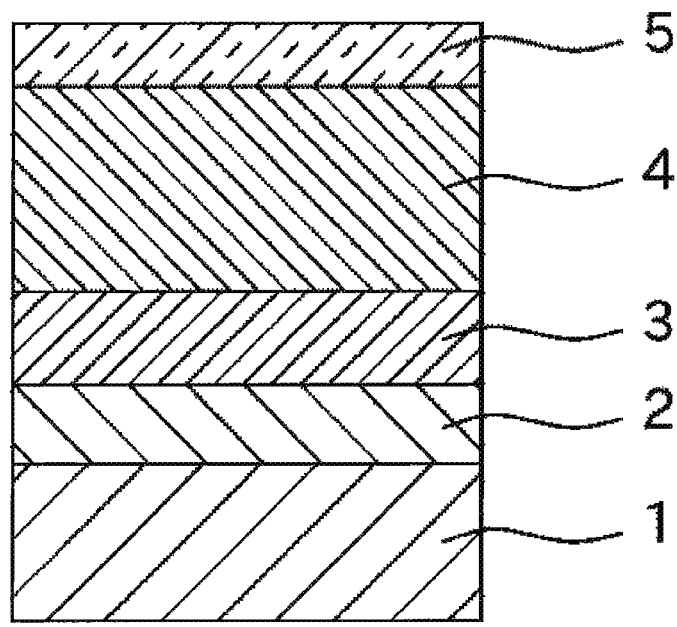
FIG. 1 is a sectional view illustrating a group III-V nitride semiconductor epitaxial wafer manufactured using a manufacturing method according to First Embodiment of the present invention.

FIG. 1 is a view schematically illustrating a cross-sectional structure of an epitaxial wafer manufactured using a manufacturing method according to First Embodiment of the present invention. The epitaxial wafer is provided with a substrate 1 made of SiC, Si, sapphire or the like. Note that a structure including the substrate 1 and various semiconductors laminated on the substrate 1 is called a "semiconductor substrate."

An AlN nucleus forming layer 2 is formed on the substrate 1. The AlN nucleus forming layer 2 is made of AlN. The AlN nucleus forming layer 2 is a buffer layer for causing to grow a GaN high resistance layer 3 or the like to be formed on this layer. The AlN nucleus forming layer 2 has a thickness of, for example, 50 nm. Note that the AlN nucleus forming layer 2 may be made of $Al_xGa_yIn_zN$ (x+y+z=1) or may have a multilayer structure resulting from laminating $Al_xGa_yIn_zN$ (x+y+z=1) layers with a plurality of compositions or may have a structure in which $Al_xGa_yIn_zN$ (x+y+z=1) is caused to grow after providing a layer made of a material such as SiN on the substrate 1.

The GaN high resistance layer 3 is formed on the AlN nucleus forming layer 2. The GaN high resistance layer 3 is made of Fe-doped GaN. The GaN high resistance layer 3 is provided for the purpose of improving a withstand voltage or improving pinch-off characteristics. The GaN high resistance layer 3 has a thickness of, for example, 300 nm. Note that the GaN high resistance layer 3 may also be made of C-doped GaN. The GaN high resistance layer 3 may not be provided.

A GaN channel layer 4 is formed on the GaN high resistance layer 3. The GaN channel layer 4 is made of undoped GaN. The GaN channel layer 4 has a thickness of, for example, 1 μm. Note that when the GaN high resistance layer 3 is not provided, the GaN channel layer 4 is formed on the AlN nucleus forming layer 2.

An $Al_xGa_{1-x}N$ barrier layer 5 is formed on the GaN channel layer 4. The $Al_xGa_{1-x}N$ barrier layer 5 is made of $Al_xGa_{1-x}N$ (0<x<1), and, for example, x=0.2. The $Al_xGa_{1-x}N$ barrier layer 5 has a thickness of, for example, 25 nm.

Note that a cap layer made of a nitride semiconductor such as GaN may be provided on the $Al_xGa_{1-x}N$ barrier layer 5.

Figure 2:
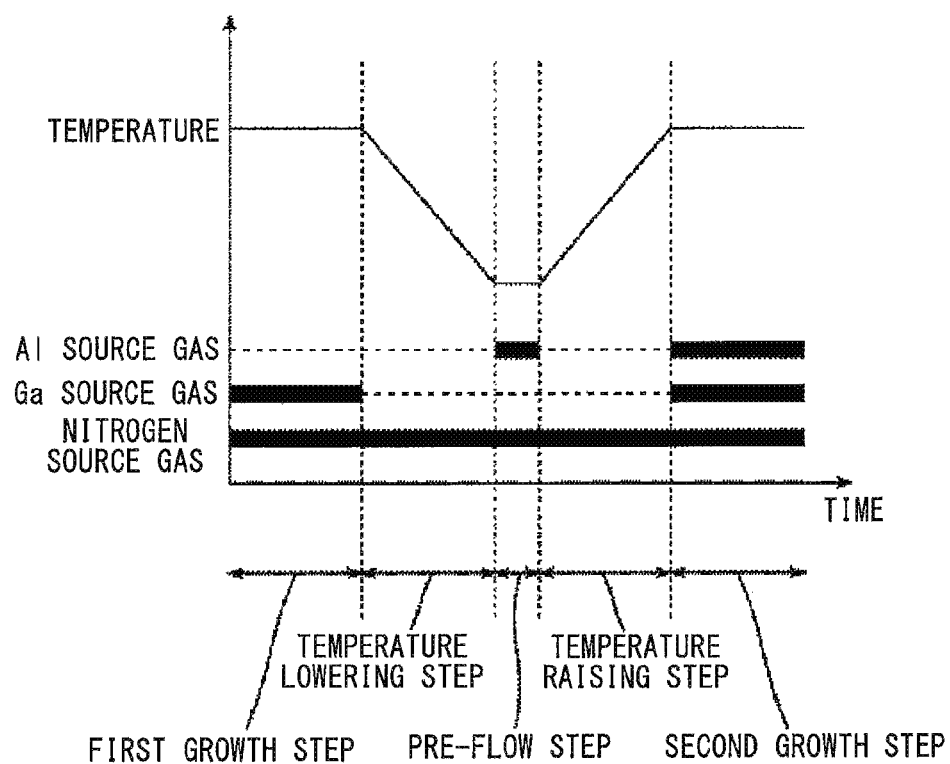
FIG. 2 is a diagram illustrating time variations of a temperature and a supply situation of each source gas in a manufacturing method according to First Embodiment of the present invention.

A method for manufacturing an epitaxial wafer according to First Embodiment of the present invention will be described below. FIG. 2 is a diagram illustrating time variations of a temperature and a supply situation of each source gas until the $Al_xGa_{1-x}N$ barrier layer 5 is grown from the GaN channel layer 4 according to this embodiment. In FIG. 2, a solid line denotes a supply and a broken line denotes stoppage of the supply as a supply situation of each source gas. As shown in FIG. 2, a nitrogen source gas is supplied all the time in all steps of a first growth step, a temperature lowering step, a pre-flow step, a temperature raising step and a second growth step. Although not shown in FIG. 2, a carrier gas is also supplied all the time in all steps as in the case of the nitrogen source gas. Regarding each source gas, trimethyl aluminum is used as the Al source gas, trimethyl gallium is used as the Ga source gas, and ammonium is used as the nitrogen source gas. Hydrogen is used as the carrier gas. Note that source gases or carrier gases other than those described above may also be used.

First, the AlN nucleus forming layer 2 is caused to grow on the substrate 1 using a metal organic chemical vapor deposition (MOCVD) method. Note that epitaxial growth of various types of layers will be described hereinafter, and such growth is assumed to be implemented using the MOCVD method. However, any method other than the MOCVD method may also be used if a product equivalent to the epitaxial layer grown using the MOCVD method can be formed.

Next, the GaN high resistance layer 3 is made to grow on the AlN nucleus forming layer 2 while supplying a dopant gas of Fe. The growth condition is, for example, a temperature of 1100° C. and a pressure of 200 mbar. The Fe doping amount is, for example, $1 \times 10^{18}$ cm$^{-3}$.

Next, the first growth step is executed in which the GaN channel layer 4 is made to grow on the GaN high resistance layer 3. In the first growth step, the Ga source gas is supplied to make the GaN channel layer 4 grow. The growth condition is, for example, a temperature of 1100° C., a pressure of 200 mbar, and a V/III ratio of 500.

After the first growth step, a temperature lowering step is executed in which the temperature is decreased. According to the embodiment, a supply of the Ga source gas is stopped in the temperature lowering step. In the temperature lowering step, an attainable temperature is preferably 900° C. or higher and 1050° C. or lower. The reason will be described in a part where a pre-flow step which is the next step is described. The attainable temperature in the present embodiment is assumed to be, for example, 1000° C. It is preferable to adjust the pressure and the flow rate of the nitrogen source gas during the temperature lowering step so that the pressure and the V/III ratio become desired settings when the pre-flow step starts.

After the temperature lowering step, the pre-flow step is executed in which the Al source gas is supplied. The growth temperature in the pre-flow step is equal to the attainable temperature in the temperature lowering step, and is preferably 900° C. or higher and 1050° C. or lower. The growth temperature is preferably set to 900° C. or higher because lowering the temperature excessively may cause crystallinity of the layer that grows in the pre-flow step to deteriorate. The growth temperature is preferably set to 1050° C. or lower because increasing the temperature excessively may cause Ga from the GaN channel layer 4 to be mixed into the layer that grows in the pre-flow step. The growth temperature in the present embodiment is assumed to be, for example, 1000° C. The growth condition other than temperature is, for example, a pressure of 50 mbar and a V/III ratio of 400. The thickness of the layer that grows in the pre-flow step is preferably 2 ML (monolayer) or lower. This is because when this thickness exceeds 2 ML, crystallinity deterioration such as lattice relaxation may occur. In First Embodiment, this thickness is assumed to be, for example, 1 ML. Since the layer that grows in the pre-flow step is very thin, illustration of the layer is omitted in FIG. 1.

After the pre-flow step, a supply of the Al source gas is stopped and a temperature raising step of raising temperature is executed. An attainable temperature in the temperature raising step is, for example, 1100° C. It is preferable to adjust the pressure and the flow rate of the nitrogen source gas during the temperature raising step so that the pressure and the V/III ratio become desired settings when the second growth step which is the next step starts.

After the temperature raising step, a second growth step of causing the $Al_xGa_{1-x}N$ barrier layer 5 to grow is executed. In the second growth step, the Al source gas and the Ga source gas are supplied to cause the $Al_xGa_{1-x}N$ barrier layer 5 to grow. The growth condition is, for example, a temperature of 1100° C., a pressure of 50 mbar and a V/III ratio of 500.

Using the manufacturing method according to First Embodiment of the present invention, it is possible to manufacture an epitaxial wafer having high steepness of composition variation on the interface between the GaN channel layer 4 and the $Al_xGa_{1-x}N$ barrier layer 5. A possible cause for a decrease of steepness of the interface is that Ga in the vicinity of the surface of the GaN channel layer 4 is detached when the $Al_xGa_{1-x}N$ barrier layer 5 is formed and is mixed into the $Al_xGa_{1-x}N$ barrier layer 5. The higher the temperature, the more likely it is for Ga to be detached or mixed. In the manufacturing method according to First Embodiment, the temperature in the pre-flow step is set to be lower than that when the GaN channel layer 4 is formed, and this suppresses detachment or mixture of Ga. For this reason, the Al composition of the layer that grows in the pre-flow step becomes Al-rich or on the same level with the $Al_xGa_{1-x}N$ barrier layer 5. Since this layer is formed, when the $Al_xGa_{1-x}N$ barrier layer 5 is formed, the mixture of Ga from the GaN channel layer 4 into the $Al_xGa_{1-x}N$ barrier layer 5 is suppressed, making it possible to increase steepness of the interface between the GaN channel layer 4 and the $Al_xGa_{1-x}N$ barrier layer 5.

Furthermore, using the manufacturing method according to First Embodiment, it is possible to manufacture an epitaxial wafer with crystallinity deterioration of the $Al_xGa_{1-x}N$ barrier layer 5 suppressed. This is because if the temperature when the $Al_xGa_{1-x}N$ barrier layer 5 is formed is low, the barrier layer with poor crystallinity grows, but the manufacturing method according to First Embodiment executes the temperature raising step before forming the $Al_xGa_{1-x}N$ barrier layer 5 and forms the $Al_xGa_{1-x}N$ barrier layer 5 at a high temperature at which crystallinity deterioration is suppressed. Setting the temperature in the pre-flow step to 900° C. or higher and setting the thickness of the layer that grows in the pre-flow step to 2 ML or lower also contribute to prevention of crystallinity deterioration.

Furthermore, use of the manufacturing method according to First Embodiment can prevent C contained in the Ga source gas from being mixed into the GaN channel layer 4 during the temperature lowering step. This is because a supply of the Ga source gas is stopped during the temperature lowering step. The mixture of C into the GaN channel layer 4 provokes transient response deterioration of a current/voltage characteristic represented by current collapse, but use of the manufacturing method according to First Embodiment suppresses the mixture of C, and as a result, the transient response deterioration is suppressed.

Second Embodiment

A cross-sectional structure of an epitaxial wafer manufactured using a manufacturing method according to Second Embodiment of the present invention is similar to that of First Embodiment and a cross-sectional view is schematically shown in FIG. 1.

Figure 3:
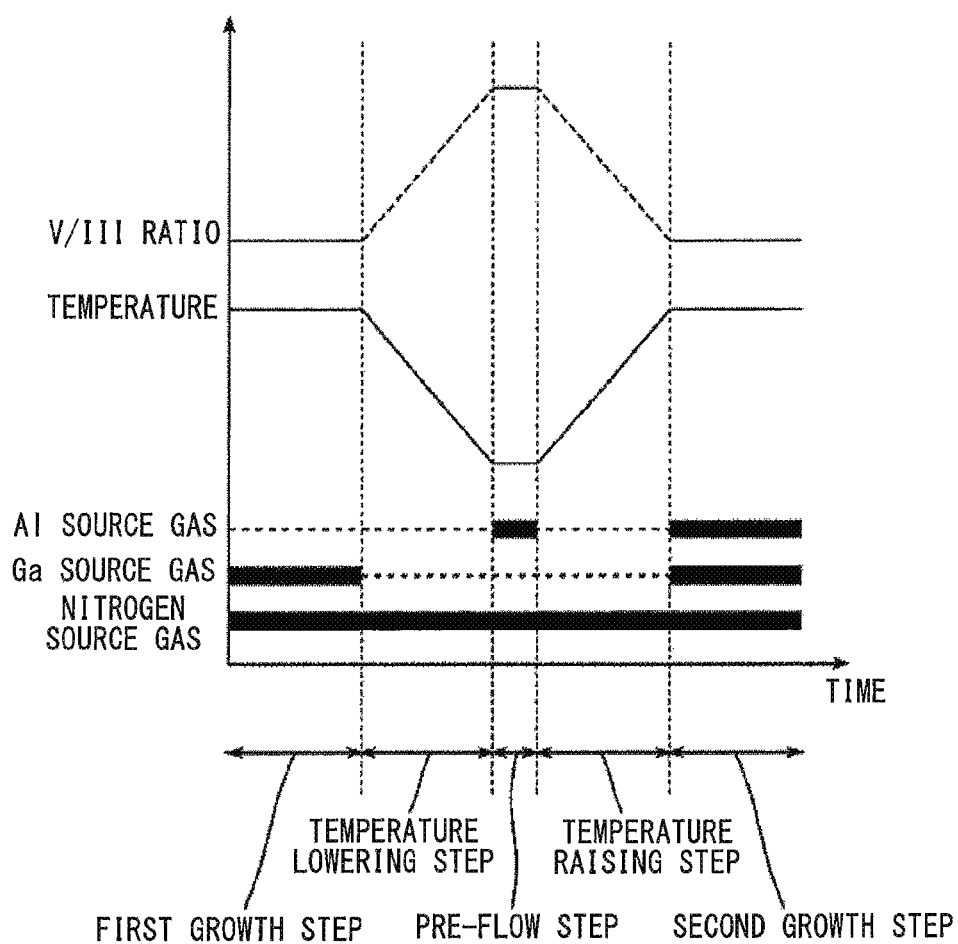
FIG. 3 is a diagram illustrating time variations of a V/III ratio, temperature and supply situation of each source gas in a manufacturing method according to Second Embodiment of the present invention.

FIG. 3 is a diagram illustrating time variations of a V/III ratio, temperature and supply situation of each source gas until the $Al_xGa_{1-x}N$ barrier layer 5 is grown from the GaN channel layer 4 according to Second Embodiment. Note that the V/III ratio cannot be defined while a supply of the group III source gas is being stopped, but parts before and after the stoppage are connected by a broken line in FIG. 3, for convenience.

Compared to First Embodiment, the manufacturing method according to Second Embodiment is characterized in that the V/III ratio in the pre-flow step is higher than those in the first growth step and the second growth step. The rest of the manufacturing method is similar to that in First Embodiment. A set value of the V/III ratio is, for example, 500 in the first growth step, 1000 in the pre-flow step and 500 in the second growth step.

Use of the manufacturing method according to Second Embodiment of the present invention makes it possible to prevent C contained in the Al source gas from mixing into the GaN channel layer 4 in the pre-flow step. This is because increasing the V/III ratio is effective in suppressing the mixture of C, and the present embodiment increases the V/III ratio in the pre-flow step. A mixture of C into the GaN channel layer 4 provokes a transient response deterioration of current/voltage characteristics represented by current collapse, but use of the manufacturing method according to Second Embodiment suppresses the mixture of C, and as a result, transient response deterioration is suppressed.

Third Embodiment

A cross-sectional structure of an epitaxial wafer manufactured using a manufacturing method according to Third Embodiment of the present invention is similar to that of First Embodiment and a cross-sectional view thereof is schematically shown in FIG. 1.

Figure 4:
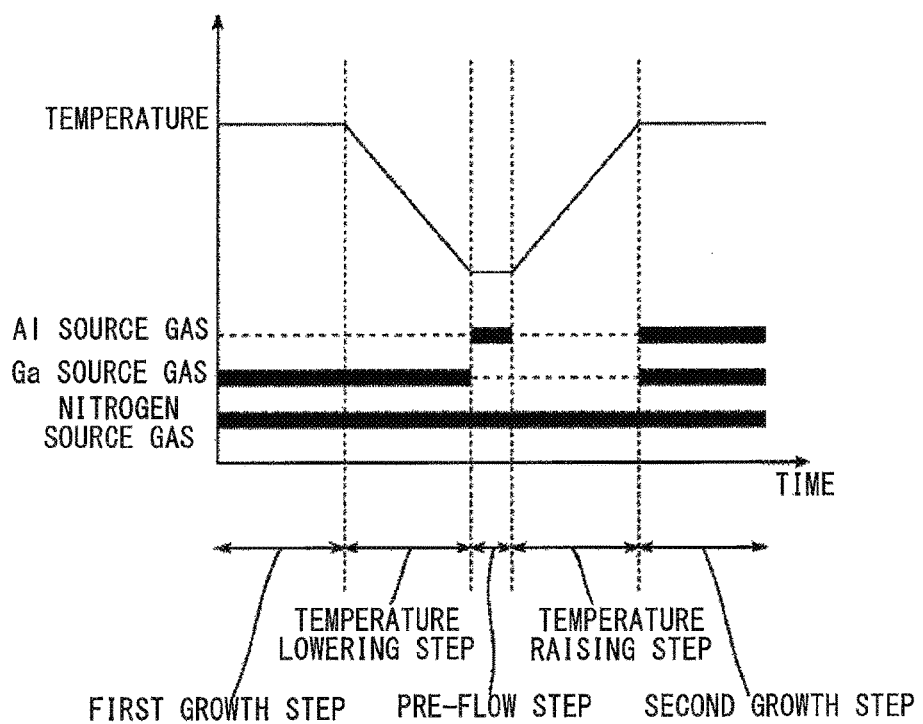
FIG. 4 is a diagram illustrating time variations of a temperature and supply situation of each source gas in a manufacturing method according to Third Embodiment of the present invention.

FIG. 4 is a diagram illustrating time variations of a temperature and supply situation of each source gas until the $Al_xGa_{1-x}N$ barrier layer 5 is grown from the GaN channel layer 4 according to Third Embodiment.

Compared to First Embodiment, the manufacturing method according to Third Embodiment is characterized by continuing to supply the Ga source gas even in the temperature lowering step and starting a pre-flow step simultaneously with stopping of a supply of the Ga source gas. The rest of the manufacturing method is similar to that in First Embodiment. The portion of the GaN channel layer 4 that grows in the temperature lowering step is preferably thin and its thickness is preferably 10 nm or lower. For this reason, in the temperature lowering step of Third Embodiment, it is preferable to lower the temperature earlier and slow down the growth speed as required.

Use of the manufacturing method according to Third Embodiment of the present invention makes it possible to prevent sticking of impurity to the surface of the GaN channel layer 4 or surface roughness. This is because sticking of impurity or surface roughness occurs during growth interruption during which the group III source gas is not supplied, but according to the present embodiment, the supply of the Ga source gas is continued even in the temperature lowering step and the pre-flow step is executed immediately thereafter, which prevents growth interruption. Sticking of impurity to the surface of the GaN channel layer 4 or surface roughness provokes mobility deterioration of a HEMT device, but use of the manufacturing method according to Third Embodiment suppresses sticking of impurity or surface roughness.

Fourth Embodiment

A cross-sectional structure of an epitaxial wafer manufactured using a manufacturing method according to Fourth Embodiment of the present invention is similar to that of First Embodiment and a cross-sectional view thereof is schematically shown in FIG. 1.

Figure 5:
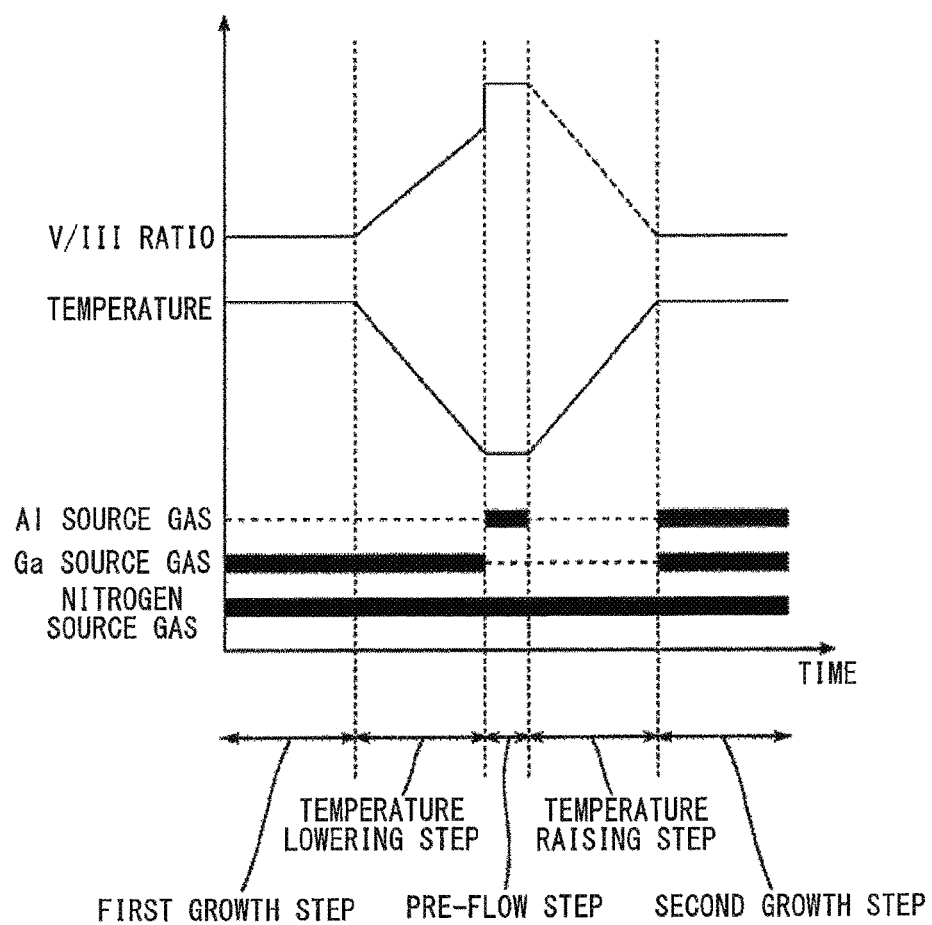
FIG. 5 is a diagram illustrating time variations of a V/III ratio, temperature and supply situation of each source gas in a manufacturing method according to Fourth Embodiment of the present invention.

FIG. 5 is a diagram illustrating time variations of a V/III ratio, temperature and supply situation of each source gas until the $Al_xGa_{1-x}N$ barrier layer 5 is grown from the GaN channel layer 4 according to Fourth Embodiment. Note that the V/III ratio cannot be defined while a supply of the group III source gas is being stopped, but parts before and after the stoppage are connected by a broken line in FIG. 5, for convenience.

The manufacturing method according to Fourth Embodiment adopts a higher V/III ratio in the pre-flow step than those in the first growth step and the second growth step, continues to supply the Ga source gas even in the temperature lowering step and starts the pre-flow step simultaneously with the stop of a supply of the Ga source gas. Furthermore, V/III is gradually increased during the temperature lowering step. The rest of the manufacturing method is similar to that in First Embodiment. A set value of the V/III ratio is, for example, 500 in the first growth step, 1000 in the pre-flow step and 500 in the second growth step. The portion of the GaN channel layer 4 that grows in the temperature lowering step is preferably thin and its thickness is preferably 10 nm or lower. For this reason, in the temperature lowering step of Fourth Embodiment, it is preferable to lower the temperature earlier and slow down the growth speed as required.

Note that in FIG. 5, the V/III ratio at the start of the pre-flow step is higher compared to that when the temperature lowering step is completed, but V/III of both steps may be equal or V/III at the start of the pre-flow step may be lower.

Use of the manufacturing method according to Fourth Embodiment of the present invention makes it possible to prevent mixing of C into the GaN channel layer 4 and further prevent sticking of impurity to the surface of the GaN channel layer 4 or surface roughness.

Note that in First to Fourth Embodiments, the barrier layer to be grown in the second growth step is formed of $Al_xGa_{1-x}N$, but it is also possible to additionally supply an In source gas to form a barrier layer made of $Al_xGa_yIn_zN$ (x+y+z=1, x>0, y>0, z>0). Furthermore, a barrier layer made of $Al_xIn_{1-x}N$ (0<x<1) may be formed without supplying the Ga source gas but by supplying the Al source gas and the In source gas. Even when the barrier layer is made of $Al_xGa_yIn_zN$ or $Al_xIn_{1-x}N$, it is possible to obtain effects similar to those when it is made of $Al_xGa_{1-x}N$.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2016-241448, filed on Dec. 13, 2016 including specification, claims, drawings and summary, on which the Convention priority of the present application is based, is incorporated herein by reference in its entirety.

The invention claimed is:

1. A method for manufacturing a group III-V nitride semiconductor epitaxial wafer comprising:
   a first growth step of supplying a Ga source gas and a nitrogen source gas to form a GaN channel layer on a semiconductor substrate;
   after the first growth step, a temperature lowering step of lowering a temperature while supplying at least the nitrogen source gas;
   after the temperature lowering step, a pre-flow step of not supplying the Ga source gas and supplying an Al source gas and the nitrogen source gas;
   after the pre-flow step, a temperature raising step of raising the temperature while not supplying the Al source gas and the Ga source gas and supplying the nitrogen source gas; and
   after the temperature raising step, a second growth step of supplying the Al source gas and the nitrogen source gas and supplying at least one of the Ga source gas and an In source gas to form a $Al_xGa_yIn_zN$ barrier layer (x+y+z=1, x>0, y≥0, z≥0, y+z>0), wherein
   all of the above steps are performed with no intermediate step performed therebetween.

2. The method for manufacturing a group III-V nitride semiconductor epitaxial wafer according to claim 1, wherein the temperature in the pre-flow step is 900° C. or higher and 1050° C. or lower.

3. The method for manufacturing a group III-V nitride semiconductor epitaxial wafer according to claim 1, wherein a thickness of a layer that grows in the pre-flow step is 2 ML or lower.

4. The method for manufacturing a group III-V nitride semiconductor epitaxial wafer according to claim 1, wherein the Ga source gas is not supplied in the temperature lowering step.

5. The method for manufacturing a group III-V nitride semiconductor epitaxial wafer according to claim 1, wherein a V/III ratio in the pre-flow step is higher than V/III ratios in the first growth step and the second growth step.

6. The method for manufacturing a group III-V nitride semiconductor epitaxial wafer according to claim 1, wherein the Ga source gas is supplied in the temperature lowering step.

7. The method for manufacturing a group III-V nitride semiconductor epitaxial wafer according to claim 1, wherein a V/III ratio in the pre-flow step is higher than V/III ratios in the first growth step and the second growth step,
   the Ga source gas is supplied in the temperature lowering step, and
   a V/III ratio is gradually increased during the temperature lowering step.

8. The method for manufacturing a group III-V nitride semiconductor epitaxial wafer according to claim 1, wherein epitaxial growth is implemented using an MOCVD method in the first growth step, the pre-flow step, and the second growth step.

9. The method for manufacturing a group III-V nitride semiconductor epitaxial wafer according to claim 6, wherein epitaxial growth is implemented using an MOCVD method in the first growth step, the temperature lowering step, the pre-flow step, and the second growth step.

10. A method for manufacturing a group III-V nitride semiconductor epitaxial wafer comprising:
   a first growth step of supplying a Ga source gas and a nitrogen source gas to form a GaN channel layer on a semiconductor substrate;
   after the first growth step, a temperature lowering step of lowering a temperature while supplying at least the nitrogen source gas;
   after the temperature lowering step, a pre-flow step of not supplying the Ga source gas and supplying an Al source gas and the nitrogen source gas;
   after the pre-flow step, a temperature raising step of raising the temperature while not supplying the Al source gas and the Ga source gas and supplying the nitrogen source gas; and
   after the temperature raising step, a second growth step of supplying the Al source gas and the nitrogen source gas and supplying at least one of the Ga source gas and an In source gas to form a $Al_xGa_yIn_zN$ barrier layer (x+y+z=1, x>0, y≥0, z≥0, y+z>0), wherein
   a V/III ratio is gradually increased during the temperature lowering step.

* * * * *